United States Patent
Honma et al.

(10) Patent No.: US 12,193,155 B2
(45) Date of Patent: Jan. 7, 2025

(54) GLASS CLOTH, PREPREG, AND PRINTED WIRING BOARD

(71) Applicant: ASAHI KASEI KABUSHIKI KAISHA, Tokyo (JP)

(72) Inventors: Hiroyuki Honma, Tokyo (JP); Amane Hirose, Tokyo (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 188 days.

(21) Appl. No.: 17/921,842

(22) PCT Filed: Jul. 16, 2021

(86) PCT No.: PCT/JP2021/026865
§ 371 (c)(1),
(2) Date: Oct. 27, 2022

(87) PCT Pub. No.: WO2022/038944
PCT Pub. Date: Feb. 24, 2022

(65) Prior Publication Data
US 2023/0189438 A1   Jun. 15, 2023

(30) Foreign Application Priority Data
Aug. 19, 2020   (JP) .................. 2020-138845

(51) Int. Cl.
*H05K 1/03* (2006.01)
*D03D 1/00* (2006.01)
*D03D 13/00* (2006.01)
*D03D 15/267* (2021.01)
*H05K 3/00* (2006.01)

(52) U.S. Cl.
CPC ......... *H05K 1/0366* (2013.01); *D03D 1/0082* (2013.01); *D03D 13/008* (2013.01); *D03D 15/267* (2021.01); *H05K 3/0047* (2013.01); *D10B 2505/02* (2013.01); *H05K 2201/029* (2013.01)

(58) Field of Classification Search
CPC ........................ H05K 1/0366; H05K 3/0047
See application file for complete search history.

(56) References Cited

U.S. PATENT DOCUMENTS

| | | | |
|---|---|---|---|
| 7,049,253 B1 | 5/2006 | Kimura et al. | |
| 2002/0051888 A1 | 5/2002 | Murari et al. | |
| 2019/0153635 A1 | 5/2019 | Ikejiri et al. | |
| 2020/0071858 A1 | 3/2020 | Ikejiri et al. | |

FOREIGN PATENT DOCUMENTS

| | | | |
|---|---|---|---|
| JP | 2001-329080 A | | 11/2001 |
| JP | 2002-242047 A | | 8/2002 |
| JP | 2004-231426 A | | 8/2004 |
| JP | 2005-42245 A | | 2/2005 |
| JP | 2006-52473 A | | 2/2006 |
| JP | 2006-63489 A | | 3/2008 |
| JP | 2008-222986 A | | 9/2008 |
| JP | 2010-31425 A | | 2/2010 |
| JP | 2011-21304 A | | 2/2011 |
| JP | 2011-241515 A | | 12/2011 |
| JP | 2014-70325 A | | 4/2014 |
| JP | 2014070325 A | * | 4/2014 |
| JP | 2016-37045 A | | 3/2016 |
| JP | 2016216859 A | * | 12/2016 |
| JP | 2018-21274 A | | 2/2018 |
| JP | 2019-19431 A | | 2/2019 |
| JP | 2019-31750 A | | 2/2019 |
| JP | 2019-104996 A | | 6/2019 |
| JP | 2020-105683 A | | 7/2020 |
| TW | 507477 B | | 10/2002 |
| TW | 202023988 A | | 7/2020 |
| WO | WO 2017/038240 A1 | | 3/2017 |
| WO | WO 2019/163159 A1 | | 8/2019 |
| WO | WO 2021/090756 A1 | | 5/2021 |

OTHER PUBLICATIONS

Machine Translation of JP 2014070325 A (Year: 2014).*
Machine Translation of JP 2016216859 A (Year: 2016).*
International Preliminary Report on Patentability, dated Feb. 16, 2023, and English translation of the Written Opinion of the International Searching Authority, dated Oct. 5, 2021, for International Application No. PCT/JP2021/026865.
"IPC-4412A Specification for Finished Fabric Woven from "E" Glass for Printed Boards," A standard developed by IPC, Jan. 2006, pp. 1-13 (22 pages total).
English translation of the International Search Report for International Application No. PCT/JP2021/026865, dated Oct. 5, 2021.

* cited by examiner

*Primary Examiner* — Jeremy C Norris
(74) *Attorney, Agent, or Firm* — Birch, Stewart, Kolasch & Birch, LLP

(57) ABSTRACT

Provided is a glass cloth obtained by weaving a glass thread, which is made from a plurality of glass filaments, as a warp and weft. The average filament diameter of the glass filaments is 3.0-4.5 μm. The respective weaving densities of the warp and the weft constituting the glass cloth are, independently, 70-130 threads/25 mm. The standard deviation of weft width of the glass cloth is not more than 30 μm. The weft covering ratio R, which is represented by the expression R=Y/(25400/D) (where R is the weft covering ratio, Y is the average weft width, and D is the weft weaving density) satisfies the relational expression 0.50≤R≤0.83.

10 Claims, No Drawings

GLASS CLOTH, PREPREG, AND PRINTED WIRING BOARD

FIELD

The present invention relates to a glass cloth, a prepreg, and a printed circuit board.

BACKGROUND

Currently, as electronic devices become more sophisticated, the density and thickness of the printed circuit boards used are remarkably increasing.

As the insulating material for these printed circuit boards, laminates obtained by impregnating a glass cloth with a thermosetting resin such as an epoxy resin (hereinafter referred to as a "matrix resin") to obtain a prepreg followed by lamination and heat pressure curing thereof are widely used. In particular, in the latest smartphones and wearable devices, the printed circuit board is miniaturized, and it is necessary that the glass cloth, which is one of the constituent materials thereof, have high quality, high performance, and ultra-thinness. Laser beam hole machining is used to form narrow-pitch vias in such printed circuit boards.

In general, the insulating base material of a printed circuit board is a composite material composed of a matrix resin, which is an organic material, and a glass cloth, which is an inorganic material, wherein the organic material and the inorganic material are unevenly distributed. Thus, in laser hole machining, variations in hole diameter occur due to differences between the processing states of these materials, resulting in drawbacks such as impairing the reliability of conductive plating. Therefore, there is a need for a glass cloth in which very small diameter holes can be formed without adversely affecting laser machinability and with which thin printed circuit boards can be provided. As a cloth having uniform laser machinability, there has been proposed a glass cloth for a printed circuit board in which adjacent yarns of at least one of the warp yarns and the weft yarns are arranged substantially without gaps (Patent Literature 1).

CITATION LIST

Patent Literature

[PTL 1] Japanese Unexamined Patent Publication (Kokai) No. 2002-242047
[PTL 2] Japanese Unexamined Patent Publication (Kokai) No. 2011-21304
[PTL 3] Japanese Unexamined Patent Publication (Kokai) No. 2004-231426
[PTL 4] Japanese Unexamined Patent Publication (Kokai) No. 2014-070325

SUMMARY

Technical Problem

However, in order to obtain a thinner glass cloth, it is necessary to reduce the basis weight of the glass cloth. Specifically, though methods such as reducing the filament diameter of the glass yarns, reducing the number of filaments per glass yarn, and reducing the weaving density of the glass cloth are used, in these methods, when attempting to obtain a glass cloth having a thickness of 16 µm or less, it is very difficult to arrange the glass yarns substantially without gaps.

Furthermore, though Patent Literature 4 describes that uniform opening can be achieved without causing opening unevenness by ultrasonic irradiation in a liquid while applying tension in the weft direction of the fiber fabric, in a glass cloth produced by the present inventors using a similar production method, the occurrence of pinholes (resin dropout when applying resin to glass cloth to prepare a prepreg) due to the narrowing of the weft yarn width was observed, and it was found that the quality was insufficient from the viewpoint of maintaining the insulation reliability of the printed circuit board.

Thus, the present invention aims to provide a glass cloth which is thin, has uniform laser drillability and pinhole inhibition, and a prepreg, printed circuit board, and laser drilling method using the same.

Solution to Problem

As a result of investigation in order to solve the problems described above, the present inventors have discovered that by controlling the shape of the glass cloth within a certain range, uniform laser drillability and the suppression of pinholes can be obtained even in a very thin glass cloth having a thickness of 16 µm or less, and have completed the present invention. Some of the aspects of the present invention are exemplified below.

[1]

A glass cloth woven using glass yarns each composed of a plurality of glass filaments as warp yarns and weft yearns, wherein an average filament diameter of the glass filaments is 3.0 to 4.5 µm, weaving densities of the warp yarns and weft yarns constituting the glass cloth are each independently 70 to 130 yarns/25 mm, a standard deviation of a weft yarn width of the glass cloth is 30 µm or less, and in the glass cloth, a weft yarn coverage ratio R, represented by the following formula:

$$R = Y/(25400/D)$$

where R is the weft yarn coverage ratio, Y is an average weft yarn width, and D is a weft yarn weaving density, satisfies the following relationship:

$$0.50 \leq R \leq 0.83.$$

[2]

The glass cloth according to Item 1, wherein a number of the glass filaments is 20 to 55.

[3]

The glass cloth according to Item 1 or 2, wherein a thickness of the glass cloth is 6 to 16 µm.

[4]

The glass cloth according to any one of Items 1 to 3, wherein the standard deviation of the weft yarn width of the glass cloth is 20 µm or less.

[5]

The glass cloth according to any one of Items 1 to 4, wherein the standard deviation of the weft yarn width of the glass cloth is 15 µm or less.

[6]

The glass cloth according to any one of Items 1 to 5, wherein a warp yarn width opening degree calculated from the warp yarn width of the glass cloth, the average filament diameter, and the number of the glass filaments is 75% or more.

[7]

A prepreg, comprising the glass cloth according to any one of Items 1 to 6, a thermosetting resin, and an inorganic filler.

[8]

A printed circuit board comprising the prepreg according to Item 7.

[9]

A laser-drilled printed circuit board, wherein the printed circuit board according to Item 8 is subjected to hole machining by laser drilling.

[10]

A method for the production of a glass cloth, comprising a weaving step in which glass yarns each composed of a plurality of glass filaments are woven as warp yarns and weft yarns, and an opening step in which an obtained glass cloth is opened with sprayed water, wherein in the opening step, pressure of the sprayed water is 0.20 MPa or less, and a warp yarn direction tension is less than 50 N.

[11]

The method for the production of a glass cloth according to Item 10, wherein an average filament diameter of the glass filaments is 3.0 to 4.5 μm, weaving densities of the warp yarns and weft yarns constituting the glass cloth are each independently 70 to 130 yarns/25 mm, a standard deviation of a weft yarn width of the glass cloth is 30 μm or less, and in the glass cloth, a weft yarn coverage ratio R, represented by the following formula:

$$R=Y/(25400/D)$$

where R is the weft yarn coverage ratio, Y is an average weft yarn width, and D is a weft yarn weaving density, satisfies the following relationship:

$$0.50 \leq R \leq 0.83.$$

Advantageous Effects of Invention

According to the present invention, a prepreg which is thin and in which the occurrence of pinholes is inhibited can be produced, and there can be provided a glass cloth with which a printed circuit board having a uniform laser-machined hole diameter can be produced, and a prepreg and printed circuit board using the glass cloth.

DESCRIPTION OF EMBODIMENTS

An embodiment (hereinafter referred to as the "present embodiment") of the present invention will be described in detail below. However, the present invention is not limited thereto, and various changes can be made within a scope which does not deviate from the spirit thereof.

[Glass Cloth]

The glass cloth of the present embodiment is woven using glass yarns each composed of a plurality of glass filaments as warp yarns and weft yearns, wherein an average filament diameter of the glass filaments is 3.0 to 4.5 μm, weaving densities of the warp yarns and weft yarns constituting the glass cloth are each independently 70 to 130 yarns/25 mm, a standard deviation of a weft yarn width of the glass cloth is 30 μm or less, and in the glass cloth, a weft yarn coverage ratio R, represented by the following formula:

$$R=Y/(25400/D)$$

where R is the weft yarn coverage ratio, Y is an average weft yarn width, and D is a weft yarn weaving density, satisfies the following relationship:

$$0.50 \leq R \leq 0.83.$$

(Weft Yarn Width Standard Deviation)

Weft yarn width standard deviation of the present embodiment refers to a standard deviation which is calculated from numerical values obtained by drawing a glass cloth roll, cutting out a 100 mm×100 mm square from an arbitrary position thereof, observing a glass cloth surface with a scanning electron microscope, and measuring the observed weft yarn width. Furthermore, weft yarn width standard deviation in a glass cloth included in a prepreg or printed circuit board refers to a standard deviation which is calculated from numerical values obtained by observing a cross section of the glass cloth perpendicular to the weft yarn in a range of 100 mm with a scanning electron microscope, and measuring the observed weft yarn width. The values of weft yarn width standard deviation obtained by these two methods are substantially the same values. In the present invention, it was found that laser drilled hole uniformity can be achieved by reducing the standard deviation, specifically to 30 μm or less, instead of using a single weft yarn width.

The standard deviation of the weft yarn width is preferably 20 μm or less. When the standard deviation of the weft yarn width is 20 μm or less, there is a tendency that the laser-drilled hole diameter can be made more uniform.

The standard deviation of the weft yarn width is more preferably 15 μm or less. When the standard deviation of the weft yarn width is 15 μm or less, there is a tendency that the laser-drilled hole diameter can be made even more uniform.

Furthermore, it is clear that the standard deviation is 0 μm or more.

Examples of the method of reducing the weft yarn width standard deviation include methods of controlling tension and processing conditions in an opening step. Specifically, examples of such a method include a method of timely monitoring the tension in the flow direction (MD direction) during opening to control the tension so that it does not deviate from a control value and a method of timely monitoring the opening pressure to control the pressure so that it does not deviate from a control value.

By maintaining the opening tension within a certain range, the bundled state of the warp yarns and the weft yarns can be controlled, and the yarn width can be maintained constant. Furthermore, by maintaining the opening pressure within a certain range, extreme opening of the weft yarns can be prevented and the yarn width can be maintained constant. According to these controls, it is possible to reduce variations in areas where the weft yarn width is extremely wide or narrow. In other words, the standard deviation of the weft yarn width can be reduced.

(Average Filament Diameter)

The average filament diameter of the glass filaments is preferably 3.5 to 4.5 μm. When the average filament diameter is 3.5 to 4.5 μm, the laser-drilled hole diameter tends to be more uniform.

The average filament diameter is more preferably 3.5 to 4.0 μm. By setting the average filament diameter to 3.5 to 4.0 μm, the laser-drilled hole diameter tends to be even more uniform.

The average filament diameter can be adjusted by changing the ratio of raw material feed speed and winding speed when spinning the glass yarns.

(Number of Glass Filaments)

The number of the glass filaments is preferably 20 to 55. When the number of the glass filaments is 20 to 55, there is a tendency that a thin glass cloth can be obtained.

The number of the glass filaments is more preferably 20 to 50, and further preferably 20 to 45. When the number of the glass filaments is 20 to 50, there is a tendency that a thinner glass cloth can be obtained, and when the number of the glass filaments is 20 to 45, there is a tendency that an even thinner glass cloth can be obtained.

The number of the glass filaments can be adjusted by changing the number of bushing holes when spinning the glass yarns.

(Weaving Density)

The weaving densities of the warp yarns and the weft yarns constituting the glass cloth are preferably each independently 80 to 130 yarns/25 mm. By adopting a weaving density of 80 to 130 yarns/25 mm, the laser-drilled hole diameters tend to be more uniform.

The weaving densities of the warp yarns and the weft yarns are each independently more preferably 90 to 130 yarns/25 mm. By adopting a weaving density of 90 to 130 yarns/25 mm, the laser-drilled hole diameters tend to be even more uniform.

The weaving densities of the warp yarns can be adjusted by changing the pitch of the combs during warp yarn warping. Furthermore, the weaving density of the weft yarns can be adjusted by changing the warp yarn feed speed of the loom when weaving the weft yarns.

(Glass Cloth Thickness)

The thickness of the glass cloth is preferably 6 to 16 μm. When the thickness of the glass cloth is 6 to 16 μm, there is a tendency that the occurrence of wrinkles can be suppressed.

The thickness of the glass cloth is more preferably 7 to 16 μm. When the thickness of the glass cloth is 7 to 16 μm, there is a tendency that the occurrence of wrinkles can be further suppressed.

The thickness of the glass cloth is more preferably 8 to 16 μm. When the thickness of the glass cloth is 8 to 16 μm, there is a tendency that the occurrence of wrinkles can be even further suppressed.

The thickness of the glass cloth can be adjusted by changing the diameter of the glass filaments, the number of the glass filaments, and the weaving density.

(Weft Yarn Coverage Ratio)

Definition

In the present embodiment, the weft yarn coverage ratio R of the glass cloth, represented by the following formula:

$R=Y/(25400/D)$ where R is the weft yarn coverage ratio, Y is an average weft yarn width, and D is a weft yarn weaving density, satisfies the following relationship:

$0.50 \leq R \leq 0.83$.

When the weft yarn coverage ratio R defined above satisfies the relationship of $0.50 \leq R \leq 0.83$, the laser machinability can be made even more uniform, the occurrence of wrinkles due to shrinkage of the weft yarns can be suppressed, and the occurrence of pinholes can be suppressed. From the same point of view, the weft yarn coverage ratio R is preferably 0.60 to 0.82, and more preferably 0.65 to 0.80.

Examples of methods for adjusting the coverage of the weft yarns to within a certain range include methods of controlling tension and processing conditions in the opening step. Specifically, examples of such methods include a method of controlling the tension in the MD direction at the time of opening to a certain level or lower, and a method of controlling the opening tension to a certain level or lower.

By maintaining the opening tension at a certain level or lower, the opening of the warp yarns can be promoted, and by restricting the movement of the weft yarns, the opening of the weft yarns can be suppressed. Further, by maintaining the opening pressure at a certain level or lower, extreme opening of the weft yarns can be prevented and the yarn width of the weft yarns can be maintained at a constant level. These controls can reduce areas where the weft yarn width is extremely wide. In other words, the weft yarn coverage can be controlled to a certain level or lower.

(Yarn Width Opening Degree)

In the present embodiment, the yarn width opening degree of the warp yarns of the glass cloth is preferably 75% or more. When the opening degree of the warp yarns is 75% or more, the frequency of occurrence of pinholes can be improved in addition to laser machinability uniformity. The opening degree of the warp yarns is more preferably 85% or more, and further preferably 95% or more. From the viewpoint of reducing variations in yarn width, the yarn width opening degree of the warp yarns is preferably 110% or less. When the opening degree of the warp yarn width is 75% or more, movement of the weft yarns can be restrained, variations in the weft yarn width can be maintained at a certain level or lower, and the laser processability tends to be uniform. Furthermore, when the warp yarn width opening degree is 110% or less, warp yarn width variation can be reduced to a certain level or lower, and the laser processability tends to be uniform.

Definition

The opening degree (%) in the present embodiment, as illustrated by the following formula, is a value which is calculated from the yarn width (μm), filament diameter (μm), and number of filaments (filament number).

Opening degree (%)=yarn width (μm)÷(filament diameter (μm)×number of filaments (filament number))×100

Examples of the method of adjusting the warp yarn opening degree to a certain level or higher include methods of controlling the tension and processing conditions in the opening step and the warping step. Specifically, examples of such methods include a method of controlling the tension in the MD direction at the time of opening to a certain level or lower, a method of controlling the opening tension to a certain level or lower, a method of applying a constant tension in the weft yarn direction (TD direction) using a tenter, a method of maintaining tension at a certain level or lower during warp yarn warping, and a method of controlling the adhesion amount during warp yarn warping to a certain level or lower.

(Fabric Weight)

The fabric weight (basis weight) of the glass cloth is preferably 5 to 16 g/m$^2$, more preferably 6 to 11 g/m$^2$, and further preferably 7 to 10 g/m$^2$. When the basis weight is within the above range, the thickness of the obtained substrate can be reduced, and by controlling the standard deviation of the yarn width of the weft yarns, the effect of laser drilling machining uniformity can more remarkably exhibited.

(Weave Structure)

The weave structure of the glass cloth is not particularly limited, and examples thereof include weave structures such as plain weave, basket weave, satin weave, and twill weave structures. Among these, a plain weave structure is preferred.

(Glass Yarn and Silane Coupling Agent)

The glass yarns (including the glass filaments) constituting the glass cloth are preferably surface-treated with a silane coupling agent. As the silane coupling agent, it is preferable to use, for example, a silane coupling agent represented by the following general formula (1):

$$X(R)_{3-n}SiY_n \qquad (1)$$

where X is an organic functional group having at least one of an amino group and an unsaturated double bond group, each Y is independently an alkoxy group, n is an integer of 1 to 3, and R is a group selected from the group consisting of a methyl group, an ethyl group, and a phenyl group.

In general formula (1), X is more preferably an organic functional group having at least three of amino groups and unsaturated double bond groups, and more preferably, X is an organic functional group having at least four of amino groups and unsaturated double bond groups.

Regarding Y in general formula (1) above, though any form can be used as the alkoxy group, an alkoxy group having 5 or fewer carbon atoms is preferable for stabilizing the glass cloth.

Specific examples of the silane coupling agent which can be used include known substances such as N-β-(N-vinylbenzylaminoethyl)-γ-aminopropyltrimethoxysilane and hydrochloride thereof, N-β-(N-vinylbenzylaminoethyl)-γ-aminopropylmethyldimethoxysilane and hydrochloride thereof, N-β-(N-di(vinylbenzyl)aminoethyl)-γ-aminopropyltrimethoxysilane and hydrochloride thereof, N-β-(N-di(vinylbenzyl)aminoethyl)-N-γ-(N-vinylbenzyl)-γ-aminopropyltrimethoxysilane and hydrochloride thereof, N-β-(N-benzylaminoethyl)-γ-aminopropyltrimethoxysilane and hydrochloride thereof, N-β-(N-benzylaminoethyl)-γ-aminopropyltriethoxysilane and hydrochloride thereof, γ-(2-aminoethyl)aminopropyltrimethoxysilane, γ-(2-aminoethyl)aminopropyltriethoxysilane, aminopropyltrimethoxysilane, vinyltrimethoxysilane, methacryloxypropyltrimethoxysilane, and acryloxypropyltrimethoxysilane, and mixtures thereof.

The molecular weight of the silane coupling agent is preferably 100 to 600, more preferably 150 to 500, and further preferably 200 to 450.

It is preferable to use two or more silane coupling agents having different molecular weights. By treating the surfaces of the glass yarns with two or more silane coupling agents having different molecular weights, the density of the treatment agent on the glass surface tends to increase and the reactivity with the matrix resin tends to be further improved.

(Loss on Ignition Value)

The loss on ignition value of the glass cloth is preferably 0.10 weight % to 1.0 weight %, more preferably 0.12 weight % to 0.90 weight %, and further preferably 0.14 weight % to 0.80 weight %.

By setting the loss on ignition value to 0.10 weight % to 1.0 weight %, the prepreg can be transported (handled) more easily than in the prior art. Furthermore, deterioration of the insulation reliability of the substrate due to the fact that the resin and the glass cloth are easily peeled off at the interface can be suppressed, and deterioration of the insulation reliability of the substrate due to the plating solution permeating the glass cloth can be suppressed.

The "loss on ignition value" can be measured in accordance with the method described in JIS R3420. Specifically, first, the glass cloth is placed in a dryer at 110° C. and dried for 60 minutes. After drying, the glass cloth is transferred to a desiccator, allowed to stand for 20 minutes, and allowed to cool to room temperature. After standing to cool, the glass cloth is weighed in units of 0.1 mg or less. Next, the glass cloth is heated in a muffle furnace at 625° C. for 20 minutes. After heating in a muffle furnace, the glass cloth is transferred to a desiccator, allowed to stand for 20 minutes, and allowed to cool to room temperature. After standing to cool, the glass cloth is weighed in units of 0.1 mg or less. The silane coupling agent treatment amount of the glass cloth is defined by the loss on ignition value obtained by this measurement method.

(Glass Type)

Though the glass cloths used in laminates are conventionally composed of glass referred to as E glass (non-alkali glass), in the glass cloth of the present embodiment, for example, L glass, NE glass, D glass, S glass, T glass, silica glass, quartz glass, or high dielectric constant glass may be used. E glass is most preferably used because it is inexpensive.

[Glass Cloth Production Method]

The glass cloth production method of the present embodiment comprises a weaving step in which glass yarns each composed of a plurality of glass filaments are woven as warp yarns and weft yarns, and an opening step in which the obtained glass cloth is opened. Though the glass cloth production method is not particularly limited, for example, a method which further comprises, in addition to the weaving step and the opening step, for example, a coating step wherein the surfaces of the glass filaments are substantially entirely covered with the silane coupling agent with a treatment liquid having a concentration of the silane coupling agent of 0.1 to 3.0 wt %, and an adhesion step in which the silane coupling agent is adhered to the surfaces of the glass filaments by heating and drying can suitably be adopted.

As the solvent for dissolving or dispersing the silane coupling agent, either water or an organic solvent can be used, but from the viewpoint of safety and protection of the global environment, it is preferable that water be used as the primary solvent. As a method of obtaining a treatment liquid containing water as a primary solvent, either a method of directly adding the silane coupling agent to water or a method of dissolving the silane coupling agent in a water-soluble organic solvent to form an organic solvent solution and then adding the organic solvent solution to water is preferable. A surfactant may be used in combination therewith to improve the water dispersibility and stability of the silane coupling agent in the treatment liquid.

As the method of applying the treatment liquid to the glass cloth, (A) a method of storing the treatment liquid in a bath and immersing therein or passing therethrough the glass cloth (hereinafter referred to as the "immersion method"), or (B) a method of directly coating the glass cloth with the treatment liquid using a roll coater, die coater, gravure coater, etc., can be adopted. In the case of coating by the immersion method of (A) above, it is preferable to select the immersion time of the glass cloth in the treatment liquid so as to be 0.5 seconds to 1 minute.

As the method of heating and drying the solvent after applying the treatment liquid to the glass cloth, known methods such as hot air and electromagnetic waves can be adopted.

The heat-drying temperature is preferably 90° C. or higher, and more preferably 100° C. or higher, so that the reaction between the silane coupling agent and the glass is sufficiently carried out. The heat drying temperature is preferably 300° C. or lower, and more preferably 200° C. or lower, in order to prevent deterioration of the organic functional groups of the silane coupling agent.

Though the opening method of the opening step is not particularly limited, for example, a method of opening the glass cloth with sprayed water (high-pressure water opening), a vibro washer, ultrasonic water, or mangle can be used. In order to reduce the maximum area of the basket holes while keeping the average area of the basket holes constant, it is preferable to perform the opening step with sprayed water.

In the case of opening with sprayed water, the water pressure is preferably set to a certain level or lower from the viewpoint of adjusting the standard deviation of the weft yarn width to be small. As used herein, setting the water pressure to a certain level or lower means, for example, that it is preferably 0.20 MPa or less, more preferably 0.19 MPa or less, and further preferably 0.18 MPa or less. Moreover, it is clear that the water pressure is 0 MPa or higher. When the spray pressure is high, opening progresses, the weft yarn width widens, and the occurrence of pinholes tends to be suppressed, but since the standard deviation of the yarn width becomes large, the uniformity of laser processability is impaired.

The tension during the opening process may also be appropriately set, and from the viewpoint of adjusting the standard deviation of the yarn width to be small, the tension is preferably set to a certain level or lower. Setting the tension to a certain level or lower means, for example, that it is preferably less than 50 N, more preferably 45 N or less, and further preferably 40 N or less. When the tension during the opening process is high, the warp yarn width tends to become narrower, and the gaps in the glass cloth become larger, but in addition to increasing the probability of pinholes, it is difficult to control the movement of the weft yarn during the opening process, and the standard deviation of the yarn width increases, resulting in a loss of uniformity in laser processing.

The glass cloth production method according to the present embodiment may comprise a step of heating and drying after the opening step.

[Prepreg]

The prepreg of the present embodiment comprises the glass cloth and a matrix resin impregnated in the glass cloth. As a result, a thin prepreg having excellent uniformity in laser drillability can be provided.

Both a thermosetting resin and a thermoplastic resin can be used as the matrix resin.

The thermosetting resin is not particularly limited, and examples thereof include a) an epoxy resin which is obtained by reacting a compound having an epoxy group with a compound having at least one of an amino group, a phenol group, an acid anhydride group, a hydrazide group, an isocyanate group, a cyanate group, a hydroxyl group, and other groups reactive with the epoxy group in the presence or absence of a catalyst having reaction catalytic ability such as an imidazole compound, tertiary amine compound, urea compound, or phosphorus compound added thereto, followed by curing; b) a radical polymerization cured resin which is obtained by curing a compound having at least one of an allyl group, a methacrylic group, and an acrylic group using a thermal decomposition catalyst or a photodecomposition catalyst as a reaction initiator; c) a maleimide triazine resin which is cured by reacting a compound having a cyanate group with a compound having a maleimide group; d) a thermosetting polyimide resin which is cured by reacting a maleimide compound with an amine compound; or e) a benzoxazine resin in which a compound having a benzoxazine ring is cross-linked and cured by heat polymerization.

The thermoplastic resin is not particularly limited, and examples thereof include polyphenylene ethers, modified polyphenylene ethers, polyphenylene sulfides, polysulfones, polyethersulfone, polyarylates, aromatic polyamides, polyetheretherketones, thermoplastic polyimides, insoluble polyimides, polyamideimides, and fluorine resins.

In the present embodiment, a thermosetting resin and a thermoplastic resin may be used together. Further, the prepreg may optionally contain an inorganic filler. The inorganic filler is preferably used in combination with a thermosetting resin, and examples thereof include aluminum hydroxide, zirconium oxide, calcium carbonate, alumina, mica, aluminum carbonate, magnesium silicate, aluminum silicate, silica, talc, short glass fibers, aluminum borate, and silicon carbide.

[Printed Circuit Board]

The printed circuit board of the present embodiment comprises the prepreg described above. As a result, a printed circuit board which is thin and excellent in laser drillability can be provided.

[Laser-Drilled Printed Circuit Board]

The printed circuit board of the present embodiment comprises the prepreg described above. As a result, a printed circuit board which is thin and has laser-drilled holes of a uniform diameter can be provided. Another aspect of the present invention provides a printed circuit board production method including a step of subjecting the printed circuit board to hole machining by laser drilling.

EXAMPLES

Next, the present invention will be described in further detailed by way of Examples and Comparative Examples. The present invention is not limited in any way by the following Examples. Each evaluation method will also be described below.

[Evaluation Methods]

<Glass Cloth Wrinkle Occurrence State Evaluation>

The frequency of the occurrence of wrinkling when 10 rolls of 2000 m glass cloths are produced is calculated, and the glass cloths are evaluated as "S" when the frequency of wrinkles is 1% or less, "G" when it is greater than 1% and 5% or less, and "B" when it exceeds 5%.

<Glass Cloth Warp Yarn Width and Weft Yarn Width Evaluation Method>

An arbitrary 100 mm×100 mm position on the glass cloth is observed using a scanning electron microscope, the widths of all of the warp yarns and the weft yarns are measured, and the average value and weft yarn width standard deviation of each are calculated. The yarn width values shown in Table 1 are average values.

<Glass Cloth Filament Diameter Evaluation Method>

At arbitrary positions on the glass cloth, cross-sections of each of 30 warp yarns and 30 weft yarns are observed with a scanning electron microscope, the filament diameters thereof are measured, and the average values thereof are calculated to obtain the average filament diameter.

<Opening Degree Evaluation Method>

Using the warp yarn width, weft yarn width, and filament diameter determined as described above, the opening degree is determined from the following formula.

Opening degree [%]=yarn width [μm]÷(filament diameter [μm]×number of filaments [filament number])×100

<Glass Cloth Thickness Evaluation Method>

In accordance with JIS R3420 7.10, using a micrometer, a spindle is gently rotated and brought into light parallel contact with the measurement surface, and the scale is read after the ratchet produced an audible sound three times.

<Prepreg Preparation Method>

The glass cloths obtained in the Examples and Comparative Examples described above are immersed in an epoxy resin varnish (in which a mixture of 40 parts by weight of low-brominated bisphenol A epoxy resin, 10 parts by weight of o-cresol novolac epoxy resin, 50 parts by weight of dimethylformamide, 1 part by weight of dicyandiamide, and 0.1 parts by weight of 2-ethyl-4-methylimidazole are diluted to 50 wt % with a methyl ethyl ketone solvent), are then drawn at a rate of 2 m/min, and excess resin is scraped off through a slit having a gap which is adjusted so that the resin content (RC) is 65%, and after drying at 160° C. for 1 minute, prepregs are obtained.

<Prepreg Thickness Evaluation Method>

In accordance with JIS R3420 7.10, using a micrometer, a spindle is gently rotated and brought into light parallel contact with the measurement surface, and the scale is read after the ratchet produced an audible sound three times, and this value is used as the thickness of the prepreg.

<Printed Circuit Board Preparation Method>

The prepreg obtained as described above is overlapped, and copper foils having a thickness of 12 μm are layered on the top and bottom thereof and then heated and pressed at 175° C. and 40 kg/cm² for 60 minutes to obtain a printed circuit board.

<Laser Drill Machinability Evaluation Method>

The printed circuit board obtained as described above is subjected to laser drilling with a hole diameter of 50 μm using a carbon dioxide gas ($CO_2$) laser drill (LC-2G212/2C) manufactured by Hitachi, Ltd., to obtain a laser drilled printed circuit board. The standard deviation of the laser-machined hole diameter is calculated by photographing the bottoms of the laser-machined holes of the laser-drilled printed circuit board with a scanning electron microscope and measuring the hole diameter at 100 points. When the standard deviation of the laser-processed hole diameter is 4 μm or less, the circuit board is considered to have passed and is evaluated as "G". When the standard deviation of the laser processing hole diameter exceeds 4 μm, it is considered a failure and evaluated as "B."

<Pinhole Evaluation Method>

An arbitrary 500 mm×500 mm portion of the prepreg is observed with an optical microscope (VHX-900) manufactured by Keyence Corporation, and the number of pinholes is counted. The smaller the number of pinholes, the higher the quality. When the number of pinholes is 10 or less, the circuit board is evaluated as "S", when it is more than 10 and 50 or less, it is evaluated as "G", and when it exceeds 50, it is evaluated as "B."

<Comprehensive Evaluation Method>

A product which passes the laser machining hole diameter variation, wrinkle, and pinhole evaluations is evaluated as "G", and when there are one or more failures, it is evaluated as "B."

Example 1

As shown in Table 1, glass yarns each composed of glass filaments were woven to form a glass cloth, which was immersed in a treatment liquid in which a hydrochloride of N-β-(N-vinylbenzylaminoethyl)-γ-aminopropyltrimethoxysilane (manufactured by Dow Corning Toray; Z6032) was dispersed in water, and dried by heating. Next, the water pressure of the spray was set to 0.15 MPa, the tension at the time of processing was set to 30 N to carry out opening followed by heat-drying, whereby an evaluation glass cloth product was obtained.

Examples 2 to 7

Evaluation glass cloth products were obtained in the same manner as Example 1, except that the filament diameters, number of filaments, weaving densities, and opening methods were changed as shown in Table 1.

Comparative Examples 1 to 4

Evaluation glass cloths were obtained in the same manner as Examples 1 to 4 except that the water pressure of the spray was set to 0.30 MPa and the tension during processing was set to 100 N to perform opening.

Comparative Examples 5 and 6

Evaluation glass cloth products were obtained in the same manner as Examples 3 and 4 except that in the opening processing, instead of opening by spraying, while applying a tension of 15 N in the weft yarn direction and a tension of 20 N in the warp yarn direction, ultrasonic irradiation was carried out in water at a frequency of 25 kHz and an output of 0.72 W/cm² for opening. An expander roller was used as to impart tension in the weft yarn direction.

The evaluation results of the glass cloths shown in the Examples and Comparative Examples are summarized in Table 1.

By using the glass cloths of the Examples, it was found that a printed circuit board which is thin, in which the occurrence of pinholes is inhibited, and which has excellent laser drilling processability can be obtained.

TABLE 1

|  | Ex 1 | Ex 2 | Ex 3 | Ex 4 | Ex 5 | Ex 6 | Ex 7 | Comp Ex 1 | Comp Ex 2 | Comp Ex 3 | Comp Ex 4 | Comp Ex 5 | Comp Ex 6 |
|---|---|---|---|---|---|---|---|---|---|---|---|---|---|
| Warp yarn filament diameter [μm] | 3.6 | 4 | 4 | 4 | 4 | 4 | 4 | 3.6 | 4 | 4 | 4 | 4 | 4 |
| Warp yarn filament number [number of filaments] | 38 | 40 | 50 | 100 | 50 | 50 | 50 | 38 | 40 | 50 | 100 | 50 | 100 |
| Warp yarn weaving density [yarns/25.4 mm] | 105 | 95 | 95 | 75 | 95 | 95 | 95 | 105 | 95 | 95 | 75 | 95 | 75 |
| Weft yarn filament diameter [μm] | 3.6 | 4 | 4 | 4 | 4 | 4 | 4 | 3.6 | 4 | 4 | 4 | 4 | 4 |
| Weft yarn filament number [number of filaments] | 38 | 40 | 50 | 100 | 50 | 50 | 50 | 38 | 40 | 50 | 100 | 50 | 100 |
| Weft yarn weaving density [yarns/25.4 mm] | 110 | 95 | 95 | 75 | 95 | 95 | 95 | 110 | 95 | 95 | 75 | 95 | 75 |

TABLE 1-continued

|  | Ex 1 | Ex 2 | Ex 3 | Ex 4 | Ex 5 | Ex 6 | Ex 7 | Comp Ex 1 | Comp Ex 2 | Comp Ex 3 | Comp Ex 4 | Comp Ex 5 | Comp Ex 6 |
|---|---|---|---|---|---|---|---|---|---|---|---|---|---|
| Glass cloth thickness [μm] | 10 | 12 | 15 | 20 | 15 | 15 | 15 | 10 | 12 | 15 | 20 | 15 | 18 |
| Warp yarn width [μm] | 131 | 144 | 140 | 200 | 140 | 140 | 160 | 131 | 144 | 140 | 200 | 150 | 240 |
| Warp yarn opening degree [%] | 96 | 90 | 70 | 50 | 70 | 70 | 80 | 96 | 90 | 70 | 50 | 75 | 60 |
| Weft yarn width [μm] | 150 | 187 | 215 | 270 | 215 | 215 | 215 | 150 | 187 | 215 | 270 | 125 | 150 |
| Weft yarn width standard deviation [μm] | 21 | 23 | 25 | 25 | 18 | 13 | 13 | 32 | 32 | 35 | 35 | 15 | 10 |
| Weft yarn coverage ratio [-] | 0.65 | 0.70 | 0.80 | 0.80 | 0.80 | 0.80 | 0.80 | 0.65 | 0.70 | 0.80 | 0.80 | 0.47 | 0.44 |
| Laser-machined hole diameter standard deviation [μm] | 3.4 | 3.3 | 3.2 | 3.0 | 3.0 | 2.8 | 2.5 | 7.5 | 6.5 | 5.5 | 4.5 | 10.0 | 6.0 |
| Laser-machined hole diameter variation | G | G | G | G | G | G | G | B | B | B | B | B | B |
| Wrinkle occurrence state | G | G | G | G | G | G | S | B | B | G | G | G | G |
| Pinhole occurrence state | G | G | G | G | G | G | S | G | G | G | G | B | B |
| Comprehensive evaluation | G | G | G | G | G | G | G | B | B | B | B | B | B |

INDUSTRIAL APPLICABILITY

The glass cloth of the present invention has industrial applicability as a base material used in a printed circuit board for use in the electronic and electrical fields.

The invention claimed is:

1. A glass cloth woven using glass yarns each composed of a plurality of glass filaments as warp yarns and weft yearns, wherein an average filament diameter of the glass filaments is 3.0 to 4.5 μm, weaving densities of the warp yarns and weft yarns constituting the glass cloth are each independently 70 to 130 yarns/25 mm, a standard deviation of a weft yarn width of the glass cloth is 30 μm or less, and in the glass cloth, a weft yarn coverage ratio R, represented by the following formula:

$$R = Y/(25400/D)$$

where R is the weft yarn coverage ratio, Y is an average weft yarn width, and D is a weft yarn weaving density, satisfies the following relationship:

$$0.50 \leq R \leq 0.83.$$

2. The glass cloth according to claim 1, wherein a number of the glass filaments is 20 to 55.

3. The glass cloth according to claim 1, wherein a thickness of the glass cloth is 6 to 16 μm.

4. The glass cloth according to claim 1, wherein the standard deviation of the weft yarn width of the glass cloth is 20 μm or less.

5. The glass cloth according to claim 1, wherein the standard deviation of the weft yarn width of the glass cloth is 15 μm or less.

6. The glass cloth according to claim 1, wherein a warp yarn width opening degree calculated from a warp yarn width of the glass cloth, the average filament diameter, and the number of the glass filaments is 75% or more.

7. A prepreg, comprising the glass cloth according to claim 1, a thermosetting resin, and an inorganic filler.

8. A printed circuit board comprising the prepreg according to claim 7.

9. A laser-drilled printed circuit board, wherein the printed circuit board according to claim 8 is subjected to hole machining by laser drilling.

10. A method for the production of a glass cloth, comprising a weaving step in which glass yarns each composed of a plurality of glass filaments are woven as warp yarns and weft yarns, and an opening step in which an obtained glass cloth is opened with sprayed water, wherein in the opening step, pressure of the sprayed water is 0.20 MPa or less, and a warp yarn direction tension is less than 50 N, and wherein an average filament diameter of the glass filaments is 3.0 to 4.5 μm, weaving densities of the warp yarns and weft yarns constituting the glass cloth are each independently 70 to 130 yarns/25 mm, a standard deviation of a weft yarn width of the glass cloth is 30 μm or less, and in the glass cloth, a weft yarn coverage ratio R, represented by the following formula:

$$R = Y/(25400/D)$$

where R is the weft yarn coverage ratio, Y is an average weft yarn width, and D is a weft yarn weaving density, satisfies the following relationship:

$$0.50 \leq R \leq 0.83.$$

* * * * *